United States Patent [19]

Li

[11] Patent Number: 4,916,513
[45] Date of Patent: Apr. 10, 1990

[54] DIELECTRICALLY ISOLATED INTEGRATED CIRCUIT STRUCTURE

[76] Inventor: Chou H. Li, 379 Elm Dr., Roslyn, N.Y. 11576

[21] Appl. No.: 838,758

[22] Filed: Oct. 3, 1977

Related U.S. Application Data

[63] Continuation-in-part of Ser. No. 154,300, Jun. 18, 1971, which is a continuation-in-part of Ser. No. 761,646, Sep. 23, 1968, Pat. No. 3,686,714, which is a continuation-in-part of Ser. No. 490,955, Sep. 28, 1965, Pat. No. 3,430,109.

[51] Int. Cl.$^4$ ............................................. H01L 27/04
[52] U.S. Cl. ......................................... 357/50; 357/55
[58] Field of Search .............................. 357/49, 50, 55

[56] References Cited

U.S. PATENT DOCUMENTS

| | | |
|---|---|---|
| Re. 28,653 | 12/1975 | Murphy .................................. 357/50 |
| 3,354,360 | 11/1967 | Campagna et al. ..................... 357/50 |
| 3,386,865 | 6/1968 | Doo ........................................ 357/50 |
| 3,430,109 | 2/1969 | Li ........................................... 357/55 |
| 3,534,234 | 10/1970 | Clevenger .............................. 357/50 |
| 3,586,542 | 6/1971 | MacRae ................................. 357/50 |
| 3,598,664 | 8/1971 | Kilby ..................................... 357/50 |
| 3,648,125 | 3/1972 | Peltzer .................................. 357/50 |

OTHER PUBLICATIONS

Sanders et al, IEEE IEDM, Technical Digest, Dec. 1973, pp. 38–40.

Primary Examiner—William D. Larkins
Attorney, Agent, or Firm—Cooper & Dunham

[57] ABSTRACT

An integrated circuit structure is made up of laterally spaced islands separated from each other by closed annular grooves of an electrically isolating matter which can be either ambient air or vacuum, or an oxide formed from the adjacent semiconductor material.

4 Claims, 2 Drawing Sheets

DIELECTRICALLY ISOLATED INTEGRATED CIRCUIT STRUCTURE

REFERENCE TO RELATED PATENTS OR APPLICATIONS

This is a continuation-in-part patent application of copending parent application Ser. No. 154,300 filed on June 18, 1971, which in turn is a continuation-in-part of patent application Ser. No. 761,646 filed Sept. 23, 1968, now U.S. Pat. No. 3,686,714, which in turn is a continuation-in-part of application Ser. No. 490,955 filed Sept. 28, 1965, now U.S. Pat. No. 3,430,109. Each of said patents and patent applications is hereby incorporated by reference into this application.

BACKGROUND AND SUMMARY OF THE INVENTION

The invention is in the field of integrated circuit structures and specifically in the field of dielectrically isolated integrated circuit structures.

Integrated circuit structures may be described as comprising a number of laterally spaced islands electrically isolated from each other so that an independent active or passive device can be formed at each island. One way of electrically isolating the islands from each other is to use PN junctions both underneath the islands and between the islands. Integrated circuits of this type are called PN junction isolated IC's. Another way of electrically isolating the islands from each other, which has significant advantages over the PN junction isolation, is to separate the islands from each other laterally by grooves of an electrically isolating matter. The islands are then electrically isolated from each other by the combination of these grooves and a PN junction region which is underneath the islands and is intersected by the grooves. This invention is directed to such dielectrically isolated integrated circuit structures and specifically relates to such structures using grooves of an electrically isolating matter that have a particularly advantageous shape, size, makeup and location relative to the PN junction region.

In one particular embodiment, the invention relates to a semiconductor material structure comprising a semiconductor material substrate of one conductivity type (e.g., P-type) and a semiconductor material layer of opposite conductivity type (e.g., N-type) disposed over a top, major surface of the substrate. An isolating PN junction region (which can also be called a depletion region, or a space-charge region) having a finite thickness extends laterally along the structure and forms an isolation barrier between regions of the substrate and layer. Closed annular grooves of an electrically isolating matter extend downwardly into the structure from the top surface of the layer, intersect the PN junction region, and divide a top portion of the structure into a number of islands which are laterally spaced from each other by the width of the grooves. Moreover, the islands are electrically isolated from each other by said grooves and said PN junction region. The grooves have shaped or curved bottoms, i.e., the distance by which each groove extends downwardly into the structure varies along at least a major portion of the width of the groove, and may vary over the entire width of the groove. Each groove has a bottom which is within one micron of the PN junction region. The interface between the groove and the semiconductor material is a surface which intersects the PN junction region non-normally. The same interface surface intersects the top surface of the islands also at a non-normal angle. This same surface is slanted or curved in vertical section at the PN junction region so as to linearly or differentially expand the PN junction region intersected by that surface. The underside of the grooves may be rounded such that the groove bottom has substantially zero width. The grooves can be formed such that the interface surface discussed above has two slopes within one micron of the PN junction region in a vertical plane. That same interface surface has a radius of curvature in the vertical plane which is in the range of one centimeter down to one micron. In vertical section, the groove may be V-shaped. The electrically isolating matter of the groove may be ambient air or vacuum, or it may be an oxide (or nitride) formed from the adjacent semiconductor material of the structure. When that electrically isolating matter is such oxide (or nitride), the top surface of the oxide (or nitride) is preferably coplanar, or substantially coplanar, with the top surface of the islands to facilitate providing electrical contact to the islands. Such oxide (or nitride) grooves may be in-situ formed by ion implantation or precision thermal diffusion or oxidation (or nitridation) at elevated temperatures, e.g., at about 700° C. or higher in an oxygen (or nitrogen) containing atmosphere.

DETAILED DESCRIPTION

Figure 1:
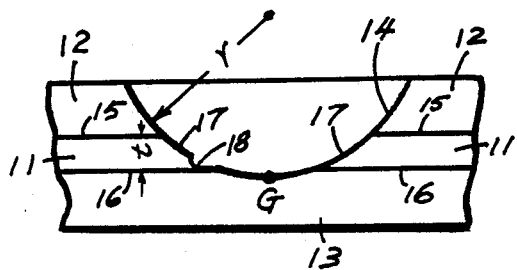
FIG. 1 illustrates a vertical section through a part of a dielectrically isolated integrated circuit structure embodying an aspect of the invention dealing with ambient isolation.
Figure 5:
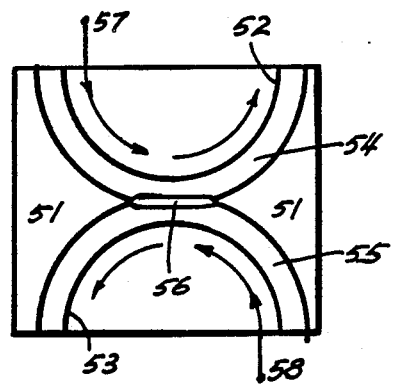
FIG. 5 shows a vertical section through a laser device.
Figure 6:
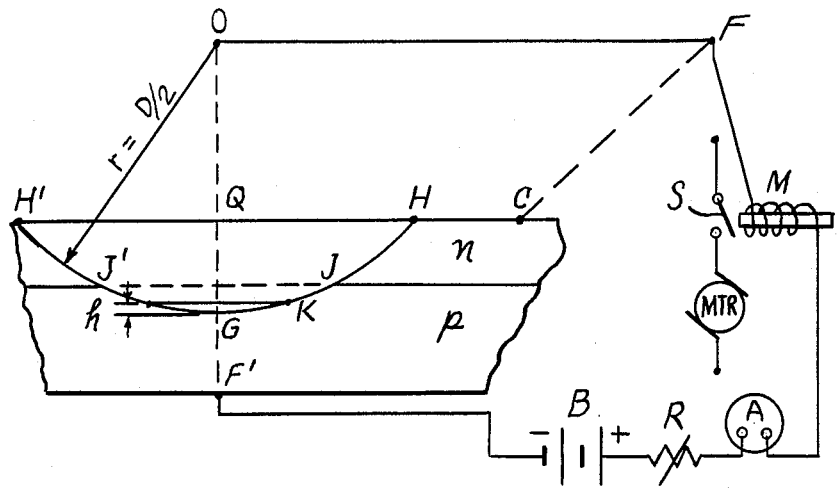
FIG. 6 shows a vertical section through a part of a dielectrically isolated integrated circuit structure in which the electrically isolating matter can be either the ambient or an oxide or nitride formed from the adjacent semiconductor material and especially illustrates an exemplary way of forming an ambient groove.

Referring to FIG. 6, which is identical to FIG. 1 of U.S. Pat. No. 3,430,109 cited above and hereby incorporated by reference, there is a semiconductor material structure comprising a semiconductor material substrate labelled P and made up, e.g., of a P-type crystalline silicon material, and a semiconductor material layer labelled N and made up, e.g., of N-type crystalline silicon. The junction region between the P-type substrate and N-type layer is an isolating PN junction region which can also be called a depletion region. This PN junction region or depletion region has a finite thickness in the vertical direction at zero applied bias; of course, this thickness varies with the degree of any bias applied to the structure. There is crystallographic continuity between the P-type substrate and N-type layer so that the two are epitaxial with respect to each other and form a single crystal material made up of regions of two different types of conductivities. The illustrated portion of the structure includes a groove defined by the boundary H'QHJKGJ'H'. This groove is made up of an electrically isolating matter which can be the ambient (e.g., air or vacuum) or an oxide or nitride formed from the surrounding silicon material. FIG. 6 illustrates a vertical section through only a small portion of an integrated circuit; the entire integrated circuit has a system of annular or close-ended grooves which completely surround each of a number of laterally spaced islands of the N-type layer (see for example FIGS. 5 and 6 of U.S. Pat. No. 3,430,109). A part of one island is the N-type material which is to the right of the groove. A part of another island is the N-type material to the left of the groove. The interface between the groove and the semiconductor material is the surface H'J'GKJH. This interface surface is curved in vertical section, and the depth of the groove into the semiconductor material varies in the illustrated case along the entire width of the groove (i.e., from H' to H). The groove has a bottom at G which is of substantially zero width and is within one micron of the PN junction region which extends along the line shown at J'J (shown as having finite thickness at FIG. 6 of U.S. Pat. No. 3,430,109). This interface surface intersects the top surface of the structure (i.e., the line H'QHC) at a non-normal angle. This same interface surface is curved where it intersects the PN junction region at J' and J so as to expand differentially the intersected surface of the junction region which, as stated above, has a finite thickness in the vertical direction. This expansion is as compared to the intersection of the junction region by a planar groove-silicon interface. The interface surface shown in FIG. 6 has slopes of opposite signs at the left and right-hand sides of its bottoms G. Since the illustrated groove is cylindrical and its bottom at G has substantially no width in the lateral direction, this interface surface has different slopes (in fact slopes of opposite signs) at two places which flank the point G and are within a micron of each other in the lateral direction. The interface surface has a radius of curvature (in the vertical plane of the drawing) which can vary from about one micron up to one centimeter.

One exemplary way of forming grooves of the type illustrated in FIG. 6 is by mechanical removal of silicon material of the desired shape so as to form the illustrated groove shape. This mechanical removal is fully described in U.S. Pat. No. 3,430,109. This mechanical removal takes place in air or some other electrically isolating ambient, as described in said patent. When the ambient is air or some other oxidizing medium, a thin layer of oxide (from about 20 to about 200 Angstroms thick) is immediately formed over the newly exposed silicon material along the surface illustrated at H'J'GKJH. In other words, the groove is partly filled in with an oxide (formed from the surrounding silicon) whose top surface is non-coplanar with that of the N-type silicon layer.

FIG. 1 of this application is substantially identical to FIG. 1 of U.S. Pat. No. 3,585,714, incorporated here by reference, except that FIG. 1 here does not show the mechanism for mechanically removing silicon material so as to form grooves illustrated at FIG. 1 of said patent and except that some reference numerals or letters are different. In FIG. 1 here, there is again shown a part of an integrated circuit comprising a substrate 13 of a semiconductor material having one conductivity type (P-type) and a semiconductor material layer 12 of opposite conductivity type (N-type). An isolating PN junction or depletion region 11 of finite thickness t extends laterally along the structure and forms an isolation barrier between the substrate 13 and layer 12. A groove extending from the top surface of the layer 12 down into the structure to the bottom point G is of an electrically isolating matter which may be the ambient (air or vacuum) or oxide or nitride formed from the surrounding semiconductor material. A much smaller groove illustrated at 18 may be formed at the PN junction region 11 to expand the intersected surface of the junction region 11 to an extent even greater than the expansion achieved without this additional small groove 18.

When the electrically isolating matter of the groove is the ambient, the groove may be formed as discussed above and as discussed in greater detail in U.S. Pat. No. 3,430,109 or U.S. Pat. No. 3,585,714 or in parent application Ser. No. 154,300. When the electrically isolating matter of the groove is to be oxide formed from the surrounding silicon material, this oxide may be formed in any one of a number of ways. One way is discussed, for example, at column 12, lines 72-75 of U.S. Pat. No. 3,585,714 and results in a structure as shown in FIG. 1, with the groove consisting essentially of silicon dioxide. Another way, once it is known in accordance with this invention what the shape and relative disposition of the groove and the rest of the structure should be, is to use various prior art processes known in the semiconductor art for making other devices. One such prior art technique is discussed in Doo, V. Y., *Silicon Nitride - A New Diffusion Mask*, IEEE Trans. on Electron Devices, Vol. 13, No. 7, 1966, pp 561-563, and involves using windows in a nitride mask for diffusion of, among other things, oxygen into silicon. Another related technique is discussed in Kennedy, D. P. and Murley, P.C., *Calculations of Impurity Atom Diffusion Through A Narrow Diffusion Mask Opening*, IBM Jour., Vol. 10, 1966, pp 6-12 (especially FIGS. 1 and 4), and Lee, T. P. and Sze, S. M., *Depletion Layer Capacitance of Cylindrical and Spherical Junctions*, Solid State Electronics, Vol. 10, 1967, pp 1105-1108, and involves the realization that the diffusional front at the edge of a mask is not planar but is convex into the silicon and is somewhat along a circle centered at the lower window edge. Thus, once known in accordance with this invention that the bottom surface of the groove must be shaped and disposed in a way illustrated in FIG. 1, an alternate way of forming the oxide groove is provided by the last cited three references, using a relatively narrow window to produce an oxide groove whose width is of the order of microns, as taught for at least some of the grooves discussed in U.S. Pat. No. 3,585,714. A still alternate prior art technique available at the time and useful to form grooves of the invented type is ion implantation as taught, for example, in U.S. Pat. No. 2,787,564. It involves selecting the geometry of implanting by controlling the energy level of the bombarding beam so that the projected ions penetrate into the interior of the silicon body to form the desired geometry to fine scale in conjunction with relative movement between the beam and the silicon material. Further refinement of the ion implantation technique that can be relied on to make the desired oxide groove taught by this invention is discussed as early as in 1957 in Shockley, U.S. Pat. No. 2,787,564, and in Gibbons, J. F., *Ion Implantation in*

*Semiconductors Part I Range Distribution Theory and Experiments*, Proc. of IEEE. March 1968, pp 295-319. The last two cited references teach in detail introducing precise amounts of impurities, such as oxygen, so as to achieve three-dimensional control in shape, size, location and composition by modulating the energy, current, duration and position of the ion beam, and the use of apertured masks, moving wafers, and ion deflection or separation systems. A still further discussion of the ion implantation technique known at the time of the invention and useful for making the invented structure, is discussed in Burrill, J. T., et al, *Ion Implantation as a Production Technique*, IEEE Trans. on Electron Devices, Vol. Ed. 14, No. 1, January 1967, pp 10-17. Further state-of-the-art information on ion implantation can be found in Buchanan, B. et al., *High-Energy (1 to 2.5 MeV) Ion Implantation for Obtaining Novel Semiconductor Junction Structures*, Int'l Conference on Applications of Ion Beams to Semiconductor Technology, Grenoble, 1967, pp 649-668, and in Blamiers, N. G., *A Preliminary Study of Semiconductor Structures Produced by Ion Implantation*, Int'l Conference on Applications of Ion Beams to Semiconductor Technology, Grenoble, 1967, pp 669-684. For example, under an implanting voltage of 1 MeV, ions such as oxygen and nitrogen ions are implanted into a silicon host to a depth of $1.7 \pm 0.13$ $\mu$m and $1.87 \pm 0.12$ $\mu$m, respectively. The width of the groove when ion implantation is used can be from about a micron up, to say, 1 centimeter, using a relative movement between the implanting beam and the silicon material, with corresponding adjustment of beam characteristics such as beam energy, current, profile and focussing, as taught in the prior art cited here, so as to achieve the groove shape and disposition taught by this invention.

Figure 2:
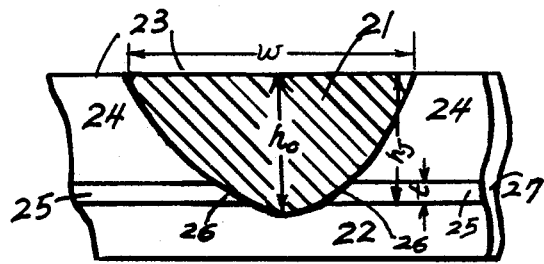
FIG. 2 is a vertical section through a part of a dielectricaly isolated integrated circuit structure embodying an aspect of the invention dealing with oxide isolation.

FIG. 2 shows a structure similar to that illustrated in FIG. 1 but limited to a groove of an electrically isolating matter consisting essentially of an oxide or a nitride formed from the surrounding silicon material. Again, what is shown is only a part of a larger structure having many islands surrounded by grooves. The structure is made up of a substrate 22 of, for example, P-type material and a layer 24 of, for example, N-type material, and a laterally extending PN isolation junction region 25 having a finite thickness t. In addition to the techniques described above, the solid electrically isolating matter shown in the shaded area in FIG. 2 may be formed according to U.S. Pat. No. 3,585,714, for example, by first forming a hollow groove and then introducing foreign oxygen or nitrogen atoms into the groove such as by ion implantation so as to form oxide or nitride grooves of the shape and disposition illustrated by the shaded area in FIG. 2; or, according also to U.S. Pat. No. 3,585,714, by grooving first and then introducing a point, line, or surface type of diffusion source at a selected location inside the groove and diffusing oxygen or nitrogen atoms therefrom three-dimensionally to achieve the desired three-dimensional control (i.e., bottom, sides and top) of the shape and disposition of the oxide groove 21 illustrated by the shaded portion of FIG. 2. While various prior art techniques can be used to different advantages to form grooves of the type illustrated at 21 in FIG. 2, the particular technique used is only a matter of balancing advantages so long as the grooves are shaped and disposed as taught in accordance with this invention. For example, coplanarity or substantially coplanarity between the top surface of the grooves 21 and the top surface of the layer 24 can be achieved by controlling, three-dimensionally, the formation of the oxide or nitride so as to end up with coplanar or substantially coplanar surfaces with or without pregrooving. Coplanarity or substantially coplanarity can be achieved alternately by permitting the top surface of the structure to deviate from coplanarity and then polishing or otherwise removing material from the top surface of the structure so as to make the top surface of the grooves 21 coplanar or substantially coplanar with the top surface of the layer 24 such as taught in, for example, Jones, R. E. and Doo, V. Y., *A Composite Insulator-Junction Isolation*, Electrochemical Technology, Vol. 5, No. 5-6, May-June, 1967. Whichever prior art technique is used to form the invented grooved structure, the particular shape and disposition of the grooves result in favorable residual stresses of the compressive type being present (see, e.g., Pfann, W. G., *Improvement of Semiconductor Devices by Elastic Strain*, Solid State Electronics, Vol 3, 1961, pp 261-267 in the silicon material due to the volume expansion occurring when converting the surrounding silicon to silicon oxide or silicon nitride.

The favorable residual stresses arise because of volume expansion during the in-situ formation of silicon (mono-, di-, or mixed) oxides from the surrounding silicon. Each silicon pocket is thus laterally subjected to substantial residual compressive stresses. Such compressive stresses strengthen the silicon pockets, and prevent them from tensile failures due to stresses arising during device processing, handling, testing, or operation. Further, when the oxide regions have symmetrical and/or rounded bottoms, these beneficial compressive stresses are distributed symmetrically and/or with lateral stresses decreasing downwardly to nil at the bottom. If, in addition, the PN isolation junction region is within one, or fractional micron, from the bottom of such oxide regions, the lateral compressive stresses on the PN junction region can not be too high to be harmful thereto.

When the oxide-silicon interface is inclined to the PN junction region, excessive stresses and strains can be somewhat relieved. When the same interface is curvedly inclined to the same PN junction region, such relief mechanism is significantly more pronounced.

Electronically, compressive stresses in the (111) plane of silicon, e.g., are shown by Pfann, *Solid State Electronics*, Vol. 3, 1961, pp 261-267, to increase the electron and hole mobility, by up to 50% or more; hence, the performance characteristics of many resultant devices are improved by such compressive stresses.

Furthermore, because of the small distance, e.g., one micron or less, between the bottom of the groove 21 and the PN junction region 25, these beneficial stresses are distributed properly where most needed, at or near the PN junction region 25 without overstressing or damaging the sensitive junction region. This distance between the bottom of the groove 21 and the PN junction region 25 can be down to 1500 Å or even down to 0 distance, in which case the bottom of the groove 21 and the PN junction region 25 coincide or substantially coincide. The groove 21 of FIG. 2 is similar to the grooves discussed in connection with FIGS. 1 and 6 with respect to the non-normal or curved intersection of the junction region by the groove-silicon interface, the non-normal intersection of the top surface of the layer 24 by the same interface, the linear or differential expansion of the intersected junction region surface, zero width at the bottom of the groove, two slopes of the interface within one micron lateral distance of the grooved bottom, and groove radius of curvature of from one or a few microns up to one centimeter.

Figure 4:
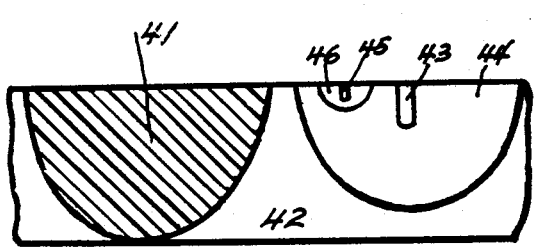
FIG. 4 illustrates a vertical section through a part of a dielectrically isolated integrated circuit structure having islands with transistors formed at each island.

FIG. 4 shows a somewhat different structure comprising a silicon material 42 which is an N-type substrate having a bottom surface exposed to the ambient, such as air. Alternately the bottom surface may contact a P-type layer 47, as shown by the dotted line of FIG. 4. A groove 41 formed of a solid dielectric material, such as oxide, is similar to the groove 21 in FIG. 2. Again, although the section of one groove 41 is shown, it is clear that what is illustrated is of a part of a structure having a system of closed annular grooves 41 dividing the substrate 42 into laterally spaced apart islands which are electrically isolated from each other by the grooves 41 and the PN isolating junction between layers 42 and 47, or by the interface between the substrate 42 and the ambient at the bottom thereof. A hole, or slot, or small groove 43, is formed into the top portion of the substrate 42 and a P-type dopant is introduced thereinto to form a P-type region 44, according to the three-dimensional diffusion technique of U.S. Pat. No. 3,585,714. Similarly, a hole, slot, or small groove 45 is formed adjacent the part 43 and an N-type dopant is introduced thereinto to form an N-type region 46. Because the dopant is introduced into a hole, slot, or small groove, as illustrated at 43 and 45, the diffusion front results in a rounded bottom surface of the area diffused into, as discussed previously in connection with diffusing oxygen or nitrogen into a groove so as to form an oxide or nitride groove similar in shape to the groove 21 in FIG. 2 or to the groove 41 in FIG. 4. The region 44 in FIG. 4 is a base region of a transistor whose emitter is region 46 and whose collector is region 42 of the same island. Similar transistors are formed at other islands, such as at the island a part of which is shown to the left of the illustrated groove 41. The oxide groove 41 can be formed by diffusing (or ion implanting) "doping or foreign atoms" oxygen through a hole, slot or small groove similar to the part 43 or 45 shown in FIG. 4. This is referred to as a three-dimensional diffusion technique in U.S. Pat. No. 3,585,714, e.g., at column 9, lines 15-25. Conventional electrical contacts to the desired regions may be made.

Figure 3A:
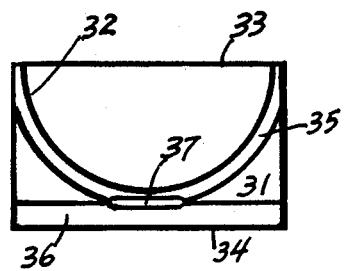
FIG. 3a and 3b illustrate intrinsic isolation as used in an integrated circuit.
Figure 3B:
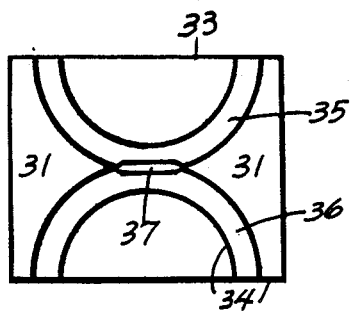

FIGS. 3a, 3b and 5 are described in detail in the parent patent application Ser. No. 154,300, which is hereby incorporated by reference.

Figure 7:
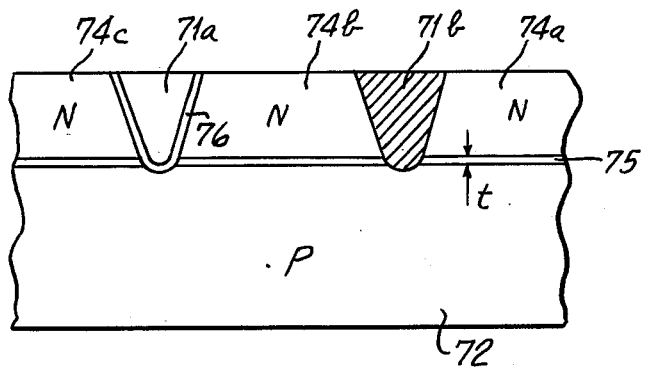
FIG. 7 illustrates a vertical section through a part of a dielectrically isolated integrated circuit structure having V-shaped grooves.

FIG. 7 illustrates a structure similar to that illustrated in FIGS. 1, 2 and 6 but having grooves which are V-shaped in vertical section. In FIG. 7 a P-type substrate 72 is separated from an N-type layer 74 by an isolating PN junction region 75 of finite thickness t. The layer 74 is divided into islands 74a, 74b and 74c by a number of V-shaped grooves of which grooves 71a and 71b are shown, it being understood that they are a part of a system of close-ended annular grooves surrounding islands such as islands 74a, 74b and 74c. The groove 71a is of an electrically isolating matter which can be only the ambient, or can be the combination of the ambient and an oxide layer 76 immediately formed from the surrounding silicon when exposed to the ambient air; while the groove 71b is entirely of an electrically isolating matter which is oxide or nitride formed in a manner similar to that discussed in connection with the groove 21 in FIG. 2 and the groove 41 in FIG. 4. The groove 71a may be formed, for example, by using a conical material removing tool as specifically discussed in U.S. Pat. Nos. 3,430,109 and 3,585,714. It should be clear that a particular structure may have only grooves of the type shown at 71a, or alternatively only grooves of the type shown in 71b, or a mixture of both types. The islands 74a, 74b and 74c and other similar islands may each contain an active device such as a transistor or a passive device such as a capacitor or resistor, and conventional electrical contacts may be made to desired regions. The bottoms of the grooves 71a and 71b are within one micron of the PN all or most of its width. The facing sidewalls of each of the V-shaped grooves intersect the PN junction region 75 non-normally. The width at the bottom of the groove is small, and can be substantially zero, so that the groove wall can have two different slopes within a micron lateral distance from the center of the groove bottom. The groove walls intersect the top surface of the layer 74 at a non-normal angle, and the top surface of the solid oxide groove 71b is coplanar or substantially coplanar with the top surface of the layer 74.

Techniques similar to those discussed above may be used where the isolation PN-junction region is replaced by the junction between a metal and a semiconductor, a metal and an oxide, an oxide and a semiconductor, or by any other electronic interfacial rectifying barrier. Instead of using oxide or nitride dielectric material at the grooves as discussed above, polysilicon or plastic materials may be used alone or in conjunction with an oxide or a nitride layer over the silicon-troove interface, understanding that the resulting structure has some different properties (e.g., no beneficial residual stresses of the type discussed above in connection with grooves made up of oxide or nitride formed from the surrounding silicon). As an alternative, the substrate may be Galium Arsenide (e.g., P-type) and the layer may be single crystal Galium Arsenide of opposite conductivity type (e.g., N-type), and the grooves may be filled with the ambient (air or vacuum) or with other electrically isolating materials such as deposited silicon oxide (possibly having a top surface coplanar with that of the layer), or a layer of silicon oxide (the remainder being the ambient or a solid material which need not be an electrically isolating one) or plastics.

I claim:
1. A semiconductor material structure comprising:
   a semiconductor material substrate of one conductivity type having an upwardly facing and laterally extending major surface;
   a semiconductor material layer of opposite conductivity type disposed on said major surface of the substrate and extending therealong;
   an isolating PN junction extending laterally along said structure and forming an isolation barrier between regions of said substrate and layer; and
   closed annular grooves of an electrically isolating matter which extend downwardly into the structure from the top surface of said layer, intersect the PN junction and divide a top portion of the structure into a plurality of islands which are laterally spaced from each other by the width of the grooves and are electrically isolated from each other by said grooves and said PN junction, each groove having a bottom which is within one micron of the PN junction;
   wherein the distance by which each groove extends downwardly into the structure varies along at least a major portion of the width of the groove; and
   wherein the interface between the groove and the semiconductor material is a surface having a curva- ture in a vertical plane at the intersection thereof with the PN junction to thereby form a differentially expanded PN junction surface.

2. A semiconductor material structure comprising:
a semiconductor material substrate of one conductivity type having an upwardly facing and laterally extending major surface;
a semiconductor material layer of opposite conductivity type disposed on said major surface of the substrate and extending therealong;
an isolating PN junction extending laterally along said structure and forming an isolation barrier between regions of said substrate and layer; and
closed annular grooves of an electrically isolating matter which extend downwardly into the structure from the top surface of said layer, intersect the PN junction and divide a top portion of the structure into a plurality of islands which are laterally spaced from each other by the width of the grooves and are electrically isolated from each other by said grooves and said PN junction, each groove having a bottom which is within one micron of the PN junction;
in which the distance by which each groove extends downwardly into the structure varies along at least a major portion of the width of the groove; and
wherein each groove has a rounded underside across at least a major portion of the groove width and a bottom of substantially zero width.

3. A semiconductor material structure comprising:
a semiconductor material substrate of one conductivity type having an upwardly facing and laterally extending major surface;
a semiconductor material layer of opposite conductivity type disposed on said major surface of the substrate and extending therealong;
an isolating PN junction extending laterally along said structure and forming an isolation barrier between regions of said substrate and layer; and
closed annular grooves of an electrically isolating matter which extend downwardly into the structure from the top surface of said layer, intersect the PN junction and divide a top portion of the structure into a plurality of islands which are laterally spaced from each other by the width of the grooves and are electrically isolated from each other by said grooves and said PN junction, each groove having a bottom which is within one micron of the PN junction;
in which the distance by which each groove extends downwardly into the structure varies along at least a major portion of the width of the groove; and
in which the interface between each groove and the semiconductor material has, at the PN junction, a radius of curvature which is in the range of one micron to one centimeter.

4. A semiconductor material structure comprising:
a semiconductor material substrate of one conductivity type having an upwardly facing and laterally extending major surface;
a semiconductor material layer of opposite conductivity type disposed on said major surface of the substrate and extending therealong;
an isolating PN junction extending laterally along said structure and forming an isolation barrier between regions of said substrate and layer; and
closed annular grooves of an electrically isolating matter which extend downwardly into the structure from the top surface of said layer, intersect the PN junction and divide a top portion of the structure into a plurality of islands which are laterally spaced from each other by the width of the grooves and are electrically isolated from each other by said grooves and said PN junction, each groove having a bottom which is within one micron of the PN junction;
in which the distance by width each groove extends downwardly into the structure varies along at least a major portion of the width of the groove; and
in which the electrically isolating oxide has a top surface which is substantially coplanar with the top surface of the islands of semiconductor material.

* * * * *

UNITED STATES PATENT AND TRADEMARK OFFICE
CERTIFICATE OF CORRECTION

PATENT NO. : 4,916,513
DATED : April 10, 1990
INVENTOR(S) : Chou H. Li

It is certified that error appears in the above-identified patent and that said Letters Patent is hereby corrected as shown below:

On the title page, under Item "[63] Related U.S. Application Data":

Line 3, change "3,686,714" to --3,585,714--.

Signed and Sealed this

Seventeenth Day of February, 1998

Attest:

BRUCE LEHMAN

Attesting Officer

Commissioner of Patents and Trademarks